(12) United States Patent
Juengling

(10) Patent No.: US 10,892,349 B2
(45) Date of Patent: *Jan. 12, 2021

(54) FINFETS WITH DEPOSITED FIN BODIES

(71) Applicant: Micron Technology, Inc., Boise, ID (US)

(72) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/551,495

(22) Filed: Aug. 26, 2019

(65) Prior Publication Data

US 2020/0052097 A1 Feb. 13, 2020

Related U.S. Application Data

(63) Continuation of application No. 15/598,894, filed on May 18, 2017, now Pat. No. 10,424,656.

(51) Int. Cl.
| | | |
|---|---|---|
| *H01L 29/10* | (2006.01) | |
| *H01L 29/66* | (2006.01) | |
| *H01L 27/108* | (2006.01) | |
| *H01L 29/78* | (2006.01) | |
| *H01L 29/04* | (2006.01) | |
| *H01L 21/8234* | (2006.01) | |
| *H01L 27/088* | (2006.01) | |

(52) U.S. Cl.
CPC ........ *H01L 29/66795* (2013.01); *H01L 21/823431* (2013.01); *H01L 27/0886* (2013.01); *H01L 27/10826* (2013.01); *H01L 27/10879* (2013.01); *H01L 29/04* (2013.01); *H01L 29/7855* (2013.01)

(58) Field of Classification Search
CPC ............. H01L 29/66795; H01L 29/04; H01L 29/7855; H01L 27/10879; H01L 27/10826
USPC .......................................... 257/66
See application file for complete search history.

(56) References Cited

U.S. PATENT DOCUMENTS

| | | |
|---|---|---|
| 5,233,207 A | 8/1993 | Anzai |
| 7,932,551 B2 | 4/2011 | Kim et al. |
| 8,149,619 B2 | 4/2012 | Kirsch et al. |
| 8,294,511 B2 | 10/2012 | Juengling |
| 8,416,610 B2 | 4/2013 | Juengling |

(Continued)

FOREIGN PATENT DOCUMENTS

CN 108933086 A 12/2018

OTHER PUBLICATIONS

Mishra, Prateek, et al., "FinFET Circuit Design", Nanoelectronic Circuit Design, (2011), 33 pgs.

(Continued)

*Primary Examiner* — Vu A Vu
(74) *Attorney, Agent, or Firm* — Schwegman Lundberg & Woessner, P.A.

(57) ABSTRACT

Electronic apparatus, systems, and methods in a variety of applications can include a fin field effect transistor (FinFET) having a deposited fin body. Such a FinFET can be implemented as an access transistor in a circuit of an integrated circuit. In an embodiment, an array of FinFETs having a deposited fin bodies can be disposed on digitlines. For the array of FinFETs having a deposited fin bodies structured in memory cells of a memory, the digitlines can be coupled to sense amplifiers. Additional apparatus, systems, and methods are disclosed.

20 Claims, 16 Drawing Sheets

(56) References Cited

U.S. PATENT DOCUMENTS

| | | | |
|---|---|---|---|
| 9,391,204 B1 | 7/2016 | Cheng et al. | |
| 9,496,267 B2 * | 11/2016 | Tonari | H01L 29/4236 |
| 10,424,656 B2 * | 9/2019 | Juengling | H01L 29/66795 |
| 2005/0245024 A1 | 11/2005 | Von Schwerin | |
| 2014/0332860 A1 | 11/2014 | Guo et al. | |
| 2015/0084127 A1 * | 3/2015 | Zhu | H01L 29/42384 |
| | | | 257/345 |
| 2016/0314839 A1 | 10/2016 | Hsu | |
| 2018/0108770 A1 | 4/2018 | Cheng et al. | |
| 2018/0337263 A1 | 11/2018 | Juengling | |

OTHER PUBLICATIONS

Smith, Bruce W, et al., "25nm Immersion Lithography at a 193nm Wavelength", Proceedings of SPIE—The International Society for Optical Engineering. 5754, (May 2005), 7 pgs.

Yu, B., et al., "FinFET Scaling to 10 nm Gate Length", Digest, International Electron Devices Meeting (IEDM '02), (2002), 4 pgs.

\* cited by examiner

100

110
FORM A STRUCTURE EXTENDING FROM A BASE ON A SUBSTRATE, INCLUDING FORMING THE STRUCTURE HAVING A FIRST DIELECTRIC WITH A DIELECTRIC SURFACE EXTENDING FROM THE BASE, THE STRUCTURE HAVING A FIRST CONDUCTIVE REGION WITHIN THE FIRST DIELECTRIC

120
DEPOSIT MATERIAL ON THE DIELECTRIC SURFACE, FORMING A FIN BODY OF A FIN FIELD EFFECT TRANSISTOR

130
FORM A SECOND DIELECTRIC CONTACTING THE FIN BODY ON A SURFACE OF THE FIN BODY OPPOSITE THE DIELECTRIC SURFACE OF THE FIRST DIELECTRIC

140
FORM A SECOND CONDUCTIVE REGION ON THE SECOND DIELECTRIC, THE SECOND CONDUCTIVE REGION SEPARATED FROM THE FIN BODY BY THE SECOND DIELECTRIC

150
FORM A DOPED REGION TO THE FIN BODY

210
FORM MULTIPLE STRUCTURES EXTENDING FROM A BASE ON A SUBSTRATE, INCLUDING FORMING EACH STRUCTURE HAVING A FIRST CONDUCTIVE REGION AND A SECOND CONDUCTIVE REGION EMBEDDED IN A FIRST DIELECTRIC AND SEPARATED FROM EACH OTHER BY THE FIRST DIELECTRIC, EACH STRUCTURE HAVING A FIRST DIELECTRIC SURFACE EXTENDING FROM THE BASE AND EXTENDING FROM THE FIRST CONDUCTIVE REGION IN THE STRUCTURE AND A SECOND DIELECTRIC SURFACE EXTENDING FROM THE BASE AND EXTENDING FROM THE SECOND CONDUCTIVE REGION IN THE STRUCTURE

220
DEPOSIT MATERIAL ON THE FIRST AND SECOND DIELECTRIC SURFACES OF EACH STRUCTURE, FORMING MULTIPLE FIN BODIES FOR MULTIPLE FIN FIELD EFFECT TRANSISTORS

230
FORM A SECOND DIELECTRIC BETWEEN EACH STRUCTURE OF THE MULTIPLE STRUCTURES CONTACTING THE DEPOSITED MATERIAL OF EACH STRUCTURE OF THE MULTIPLE STRUCTURES, EACH SECOND DIELECTRIC INCLUDING A THIRD CONDUCTIVE REGION AND A FOURTH CONDUCTIVE REGION EMBEDDED IN THE SECOND DIELECTRIC BETWEEN TWO STRUCTURES OF THE MULTIPLE STRUCTURES, THE THIRD CONDUCTIVE REGION AND THE FOURTH CONDUCTIVE REGION SEPARATED FROM EACH OTHER BY THE SECOND DIELECTRIC

240
FORM A DOPED REGION TO THE DEPOSITED MATERIAL, THE DOPED REGION FORMED ON THE MULTIPLE STRUCTURES AND SECOND DIELECTRIC OPPOSITE THE BASE

250
REMOVE PORTIONS OF THE DOPED REGION, THE DEPOSITED MATERIAL FOR THE FIN BODIES, AND THE SECOND DIELECTRIC, TO DEFINE THE MULTIPLE FIN FIELD EFFECT TRANSISTORS, EACH FIN FIELD EFFECT TRANSISTOR HAVING TWO GATES

260
COUPLING THE FIN FIELD EFFECT TRANSISTORS TO CHARGE STORAGE ELEMENTS

FIG. 2

FINFETS WITH DEPOSITED FIN BODIES

PRIORITY APPLICATION

This application is a continuation of U.S. application Ser. No. 15/598,894, filed May 18, 2017, which is incorporated herein by reference in its entirety.

BACKGROUND

The semiconductor device industry has a market-driven need to improve the operation of electronic devices. For example, improvements to the size and/or avoidance of processing remnants of various types of transistor devices are desired. Such transistors can be used in a variety of applications such as, but not limited to, memory devices. One such transistor is the fin-type field-effect transistors (FinFET). FinFETs can have a fin-based, multigate transistor architecture. Improvements in transistors such as FinFETs can be addressed by advances in device design and/or processing.

BRIEF DESCRIPTION OF THE DRAWINGS

FIG. 1 is a flow diagram of features of an example method of fabricating a fin-type field-effect transistor with a deposited fin body, in accordance with various embodiments.

FIG. 2 is a flow diagram of features of an example method of fabricating a memory device having multiple fin-type field-effect transistors with deposited fin bodies, in accordance with various embodiments.

DETAILED DESCRIPTION

Figure 3:
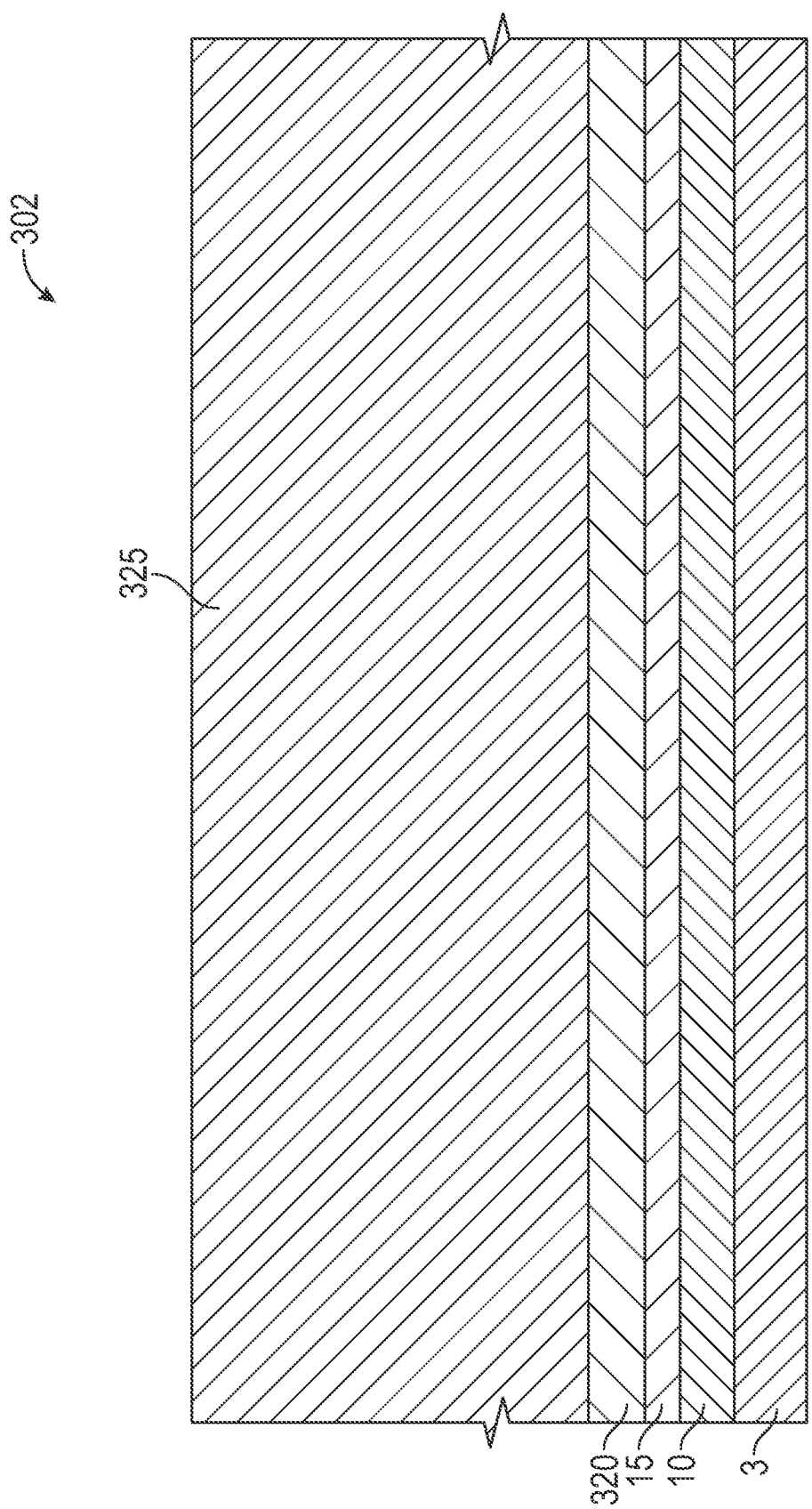
FIGS. 3-14 illustrate features for an example process that forms deposited fin bodies of fin-type field-effect transistors in an array in a device, in accordance with various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a FinFET can be structured with a deposited film as the fin body of the FinFET. A deposited fin body is a fin structure formed substantially by deposition of material for the deposited fin body without significant removal of the material deposited. The fin body is structured to include the channel for the transistor. The fin body can be a polycrystalline (herein, also referred to as poly) semiconductor, in which the deposited film is very thin. The poly can be realized by poly silicon. Other poly semiconductor materials or combination of semiconductor materials can be used, such as, but not limited to, a germanium poly alloy. The deposited film of the fin body can have a thickness in the nanometer range, for example, a thickness in the range of 10 to 30 nanometers. The deposited film of the fin body can be constructed as multi films of various materials. Process flows, as taught herein, can provide FinFET devices having deposited fin bodies, while avoiding small features standing by themselves in the devices. For example, such processing can avoid free standing features of less than 24 nm. Such process flows used for forming arrays of cells can be performed as cross-point processes that avoid misalignments. The array of cells can be memory cells in a semiconductor based memory device.

A FinFET having a deposited fin body provides a device having different surface characteristics compared to conventional FinFETs. Conventional FinFETs have fin bodies formed by etching of a block of material such as, for example, by dry etching. A thick film of poly grown on a surface can grow very large grains that can span several cells. Many cells will therefore "see" crystalline semiconductor material, such as crystalline silicon, but often an etched out thin fin will include one of the grain boundaries and have very different leakage characteristics compared to the those fins that do not have grain boundaries from the large grains. Another issue associated with large grains is crystal orientation. <111> planes have different mobility compared to <100> or <110> planes and will yield variation in maximum current drive in the on-state (Ion). Gate oxide growth can also vary with crystal orientation of the large grain. On the other hand, a thin deposited film will be more amorphous or crystallize in small crystals that are much smaller than a fin size and provide more uniform material due to statistical distribution of many small poly crystals inside the fin. The material might be worse by average compare to fins without a grain boundary but better than fins containing a large grain boundary. Uniformity by statistical characteristics of many small poly grains of the deposited film can outweigh better performance of cells within a large grain without a grain boundary that are combined with worse performance of cells having grain boundaries of the large grains in the etched fin. The differences between a FinFET having a deposited fin body, as described herein, and a conventional FinFET may be observed, in many examples, through enhanced leakage characteristic of the FinFET having a deposited fin body compared with the conventional FinFET. FinFET devices having deposited fin bodies can also be structured without small features standing by themselves in the devices as residuals of the FinFET processing, which typically accompany formation of conventional FinFETs.

The FinFETs with deposited fin bodies can be fabricated for a number of different applications. FinFETs, individually or as a group, can be formed in an integrated circuit. For example, in integrated circuit devices, a FinFET may be used as an access component device. In an electronic memory, each memory cell of a memory array of the electronic memory can include a FinFET to access a storage element of the memory cell. As taught herein, fabrication of a set of FinFETs having fin bodies for different device application can include similar fabrication techniques for the deposition of the fin bodies.

FIG. 1 is a flow diagram of features of an embodiment of an example method 100 of fabricating a FinFET with a deposited fin body. At 110, a structure is formed extending from a base on a substrate, where the structure has a first dielectric with a dielectric surface extending from the base, and the structure has a first conductive region within the first dielectric. Forming the structure extending from the base on the substrate can include forming the first conductive region extending from above the base to a level less than a top surface of the structure; and forming the first dielectric as part of a first region adjacent to and contacting the first conductive region. The first dielectric and the first region may have the substantially same dielectric oxide composition. The dielectric oxide composition can include, but is not limited to, silicon oxide. Forming the structure extending from the base on the substrate can include forming the base by forming a conductive region on the substrate, where the conductive region can be formed as a digitline for the device; and forming a doped region on and contacting the digitline such that the structure is formed extending from the doped region.

At 120, material is deposited on the dielectric surface, forming a fin body of a fin field effect transistor. Depositing material on the dielectric surface can include depositing a polycrystalline silicon material. Other polycrystalline semiconductor material can be used. The deposition can include, but is not limited to, chemical vapor deposition, atomic layer deposition, or variations thereof.

At 130, a second dielectric is formed contacting the fin body on a surface of the fin body opposite the dielectric surface of the first dielectric. The first dielectric and the second dielectric can be formed of the same material. Such dielectrics can include silicon oxide or a high-κ dielectric material. A high-κ dielectric material is a dielectric material having a dielectric constant (κ) higher than the dielectric constant of silicon dioxide. At 140, a second conductive region is formed on the second dielectric, where the second conductive region is separated from the fin body by the second dielectric. The second conductive region may be composed of the same material as the first conductive region. For example, the first and second conductive regions can include, but are not limited to, titanium nitride.

At 150, a doped region to the fin body is formed. Forming the doped region to the fin body can include forming the doped region on a portion of the deposited material that is substantially perpendicular to the formed fin body. The doped region and the deposited material forming the fin body can be composed of the same material, but with the doped region doped more heavily than the deposited material, which may be undoped or doped at orders of magnitude less than the doped region. For example, if doped, the deposited material may be doped at around $10^{15}$ cm$^{-3}$, while the doped region may be $10^{18}$ cm$^{-3}$. The fabricated FinFET can be coupled with one or more other components of a device for which the FinFET is constructed.

FIG. 2 is a flow diagram of features of an embodiment of an example method 200 of fabricating a memory device having multiple FinFETs with deposited fin bodies. At 210, multiple structures are formed extending from a base on a substrate, including forming each structure having a first conductive region and a second conductive region embedded in a first dielectric and separated from each other by the first dielectric. Each formed structure has a first dielectric surface extending from the base and extending from the first conductive region in the structure and a second dielectric surface extending from the base and extending from the second conductive region in the structure. Forming multiple structures extending from the base can include forming the base along a digitline line for the device. Fabricating the memory device can include patterning in a direction perpendicular to the digitline line forming an array of cells coupled to multiple digitlines, where each digitline is physically and electrically separate from each other.

At 220, material is deposited on the first and second dielectric surfaces of each structure, forming multiple fin bodies for multiple fin field effect transistors. Depositing the material forming multiple fin bodies for multiple fin field effect transistors can include depositing the material for a 48 nm array pitch. Prior to depositing material on the first and second dielectric surfaces of each structure, method 200 or methods identical or similar to method 200 can include forming a thin polycrystalline semiconductor region on the first and second dielectric surfaces of each structure; and depositing material on the first and second dielectric surfaces of each structure can include depositing the material on the thin polycrystalline semiconductor region, the thin polycrystalline semiconductor region being thin relative to the deposited material.

Method 200 or methods similar to method 200 can include depositing material forming multiple fin bodies to include depositing the material by chemical vapor deposition or by atomic layer deposition. Such methods can include depositing material forming multiple fin bodies to include forming each fin body to have a thickness in the range of 10 angstroms to 100 angstroms. Depositing material on the first and second dielectric surfaces of each structure can include depositing the material on a doped region formed on and contacting a conductive region formed on the substrate, the conductive region formed as a digitline for the device. Forming the multiple fin field effect transistors can include forming the multiple fin field effect transistors material deposited on the doped region formed on and contacting the conductive region.

At 230, a second dielectric is formed between each structure of the multiple structures contacting the deposited material of each structure of the multiple structures. Each second dielectric includes a third conductive region and a fourth conductive region embedded in the second dielectric between two structures of the multiple structures, where the third conductive region and the fourth conductive region are separated from each other by the second dielectric. Method 200 or a method identical or similar to method 200 can include forming the first, second, third, and fourth conductive regions as titanium nitride gates. Other conductive material may be used as gates. Such conductive material can be conductive material having low ohmic resistivity.

At 240, a doped region is formed connected to the deposited material, where the doped region is formed on the multiple structures and second dielectric opposite the base. The doped regions and the deposited material may be formed of poly semiconductor material in which the deposited material may be undoped or lightly doped relative to the doped regions. At 250, portions of the doped region, the deposited material for the fin bodies, and the second dielectric are removed, to define the multiple fin field effect transistors, each fin field effect transistor having two gates.

At 260, the fin field effect transistors are coupled to charge storage elements. Coupling the fin field effect transistors to charge storage elements may include forming a capacitor coupled to a portion of the doped region, formed on the multiple structures and on the second dielectric opposite the base, remaining after removing a portion of the doped region.

FIGS. 3-14 illustrate features for an embodiment of a process that forms a deposited fin body of a FinFET in a device. FIG. 3 is representation of a cross-sectional view of a structure 302 having materials formed on a substrate 3 in the fabrication of the device. Substrate 3 may be a silicon-based substrate or other semiconductor based substrate. This view in FIG. 3 is along what will be a digitline 10 of the device in this example embodiment. Digitline 10 is formed as a conductive region. The conductive material for digitline 10 can include tungsten (W), for example. Other conductive material can be used, for example, conductive material having a low ohmic resistivity. For convenience of reference, the cross-sectional view is taken to be in the x-y plane.

A doped region 15 can be formed on digitline 10, and a dielectric region 320 can be formed on and contacting doped region 15. Doped region 15 can a doped n-type or p-type semiconductor, and can be formed as a heavily doped region, n+ or p+, relative to fin bodies of FinFETs to be structured. The semiconductor can be realized as a poly semiconductor. Optionally, a barrier region may be formed between doped region 15 and digitline 10. Dielectric region 320 can be formed as an oxide such as, but not limited to, silicon oxide. A sacrificial region 325 can be formed on the dielectric region 320. Sacrificial region 325 can be used to form various structures coupled to digitline 10. An appropriate material that can be used as sacrificial region 325 is an insulating nitride. Silicon nitride can be used as sacrificial region 325, though other materials may be used. Digitline 10, dielectric region 320, and doped region 15 can be formed using conventional processing of material regions in a semiconductor-based device.

At this point in the process, a number of digitlines with material regions formed thereon as shown in FIG. 3 can be patterned parallel to digitline 10 in the z direction, though not shown here for ease of discussion. The digitlines may be formed as part of an array with a selected pitch. For example, the digitlines may be formed with a 48 nm pitch. Such a 48 nm pitch can include 24 nm of structure and 24 nm of space. The digitlines in the completed structure provide signal lines.

Figure 4:
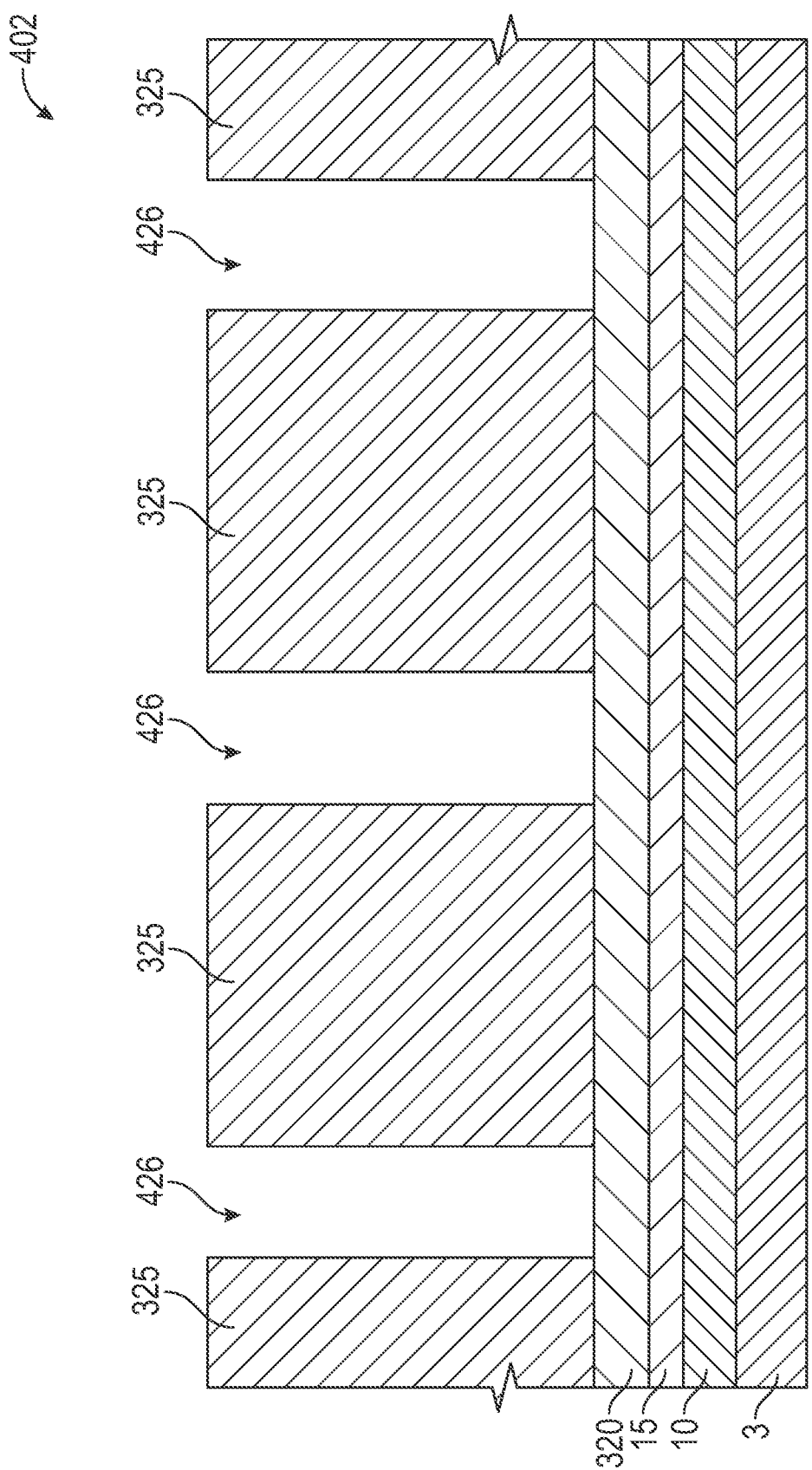

FIG. 4 illustrates change to structure 302 of FIG. 3 after processing to remove selected regions of sacrificial region 325. The removal of the selected regions can be performed by etching sacrificial region 325 with an appropriate mask to provide a pattern on digitline 10. This pattern can provide trenches 426 forming structure 402. The pattern may be selected such that each trench 426 can have a 24 nm length along the direction of digitline 10. The trenches 426 can be separated from each other along the digitline 10 by a length of 24 nm of sacrificial region 325. Other trench patterns may be implemented.

Figure 5:
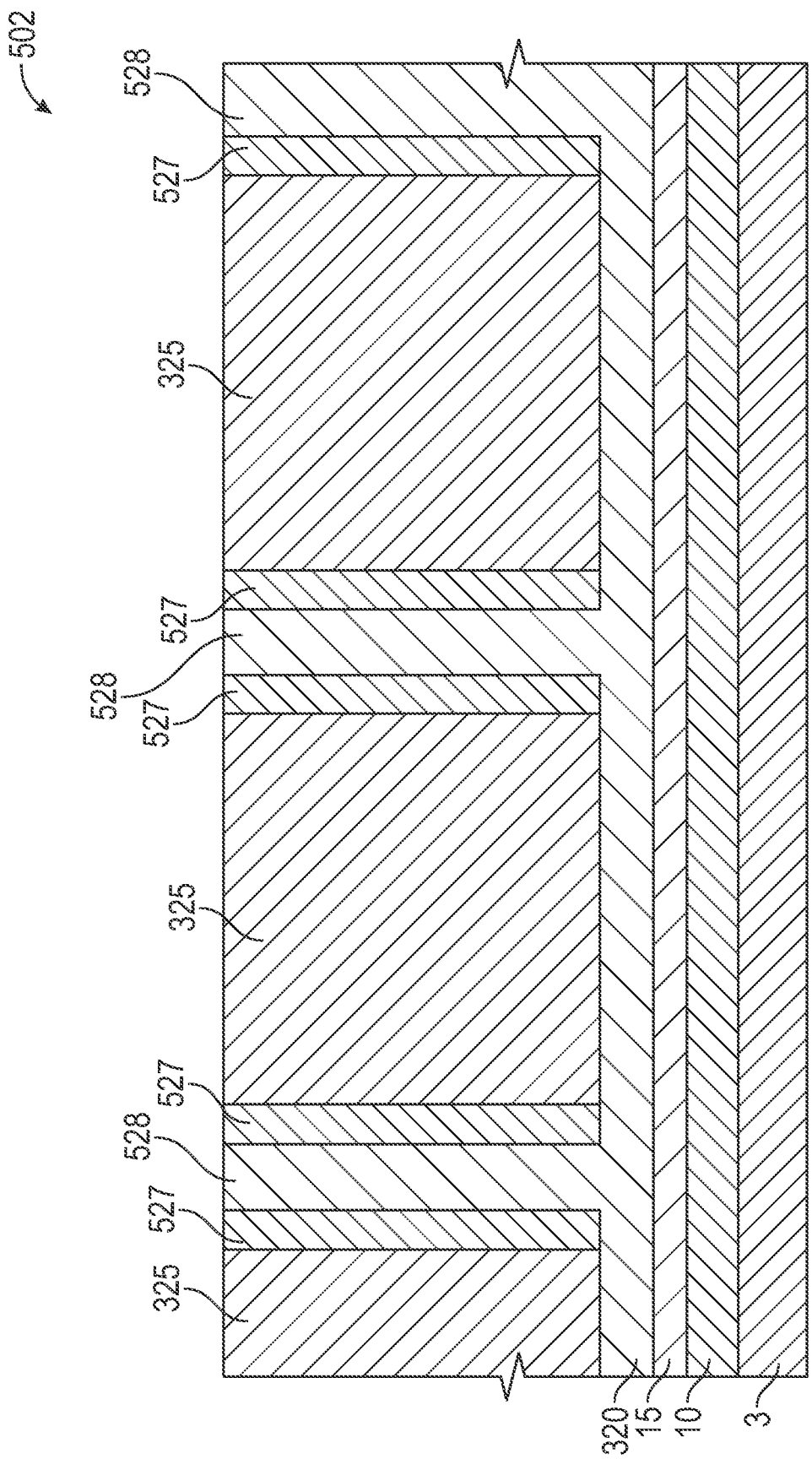

FIG. 5 illustrates change to structure 402 of FIG. 4 after processing to fill the trenches 426 and conducting a chemical mechanical polish (CMP). In this processing, each trench 426 can be filled with a conductive region. The conductive region can be formed of TiN, for example. Other conductive materials may be used. These conductive regions can be subjected to a spacer etch such that, in each previously unfilled trench 426, the conductive region remaining has two conductive regions 527 separated from each other. The conductive regions 527 can be used to form first access lines. Such first access lines can be substantially perpendicular to digitline 10 in the z-direction. The first access lines may be word lines. The region of separation between the two conductive regions 527 can be filled with a dielectric material 528. Dielectric material 528 can be formed of the same material as the material of dielectric region 320. Dielectric material 528 can be an oxide such as, but not limited to, silicon oxide. After filing the trenches 426, a chemical mechanical polish (CMP) can be conducted forming structure 502.

Figure 6:
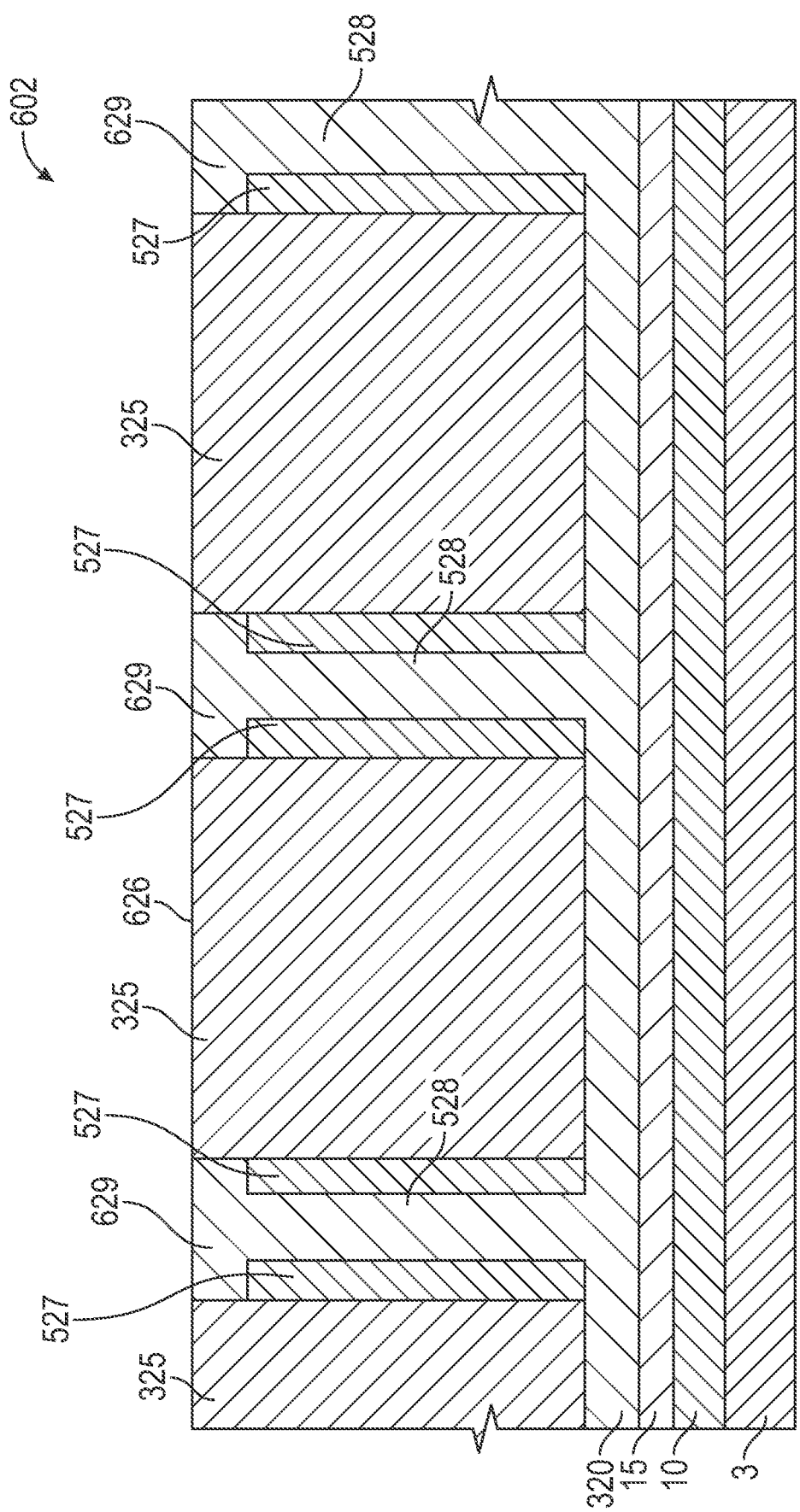

FIG. 6 illustrates change to structure 502 of FIG. 5 after processing to recess material between the sections of sacrificial region 325 and to fill the removed regions between the sections of sacrificial region 325 to form structure 602. In this processing, the two conductive regions 527 and dielectric material 528 can be etched to recess the two conductive regions 527 and dielectric material 528 from the top surface 626 of sacrificial region 325. The removed portion of the two conductive regions 527 and dielectric material 528 can be filled with a dielectric region 629. The material of dielectric region 629 can be the same in composition as the material of dielectric material 528. One or both of the materials of dielectric material 528 and dielectric region 629 may be an oxide. CMP may then be conducted.

Figure 7:
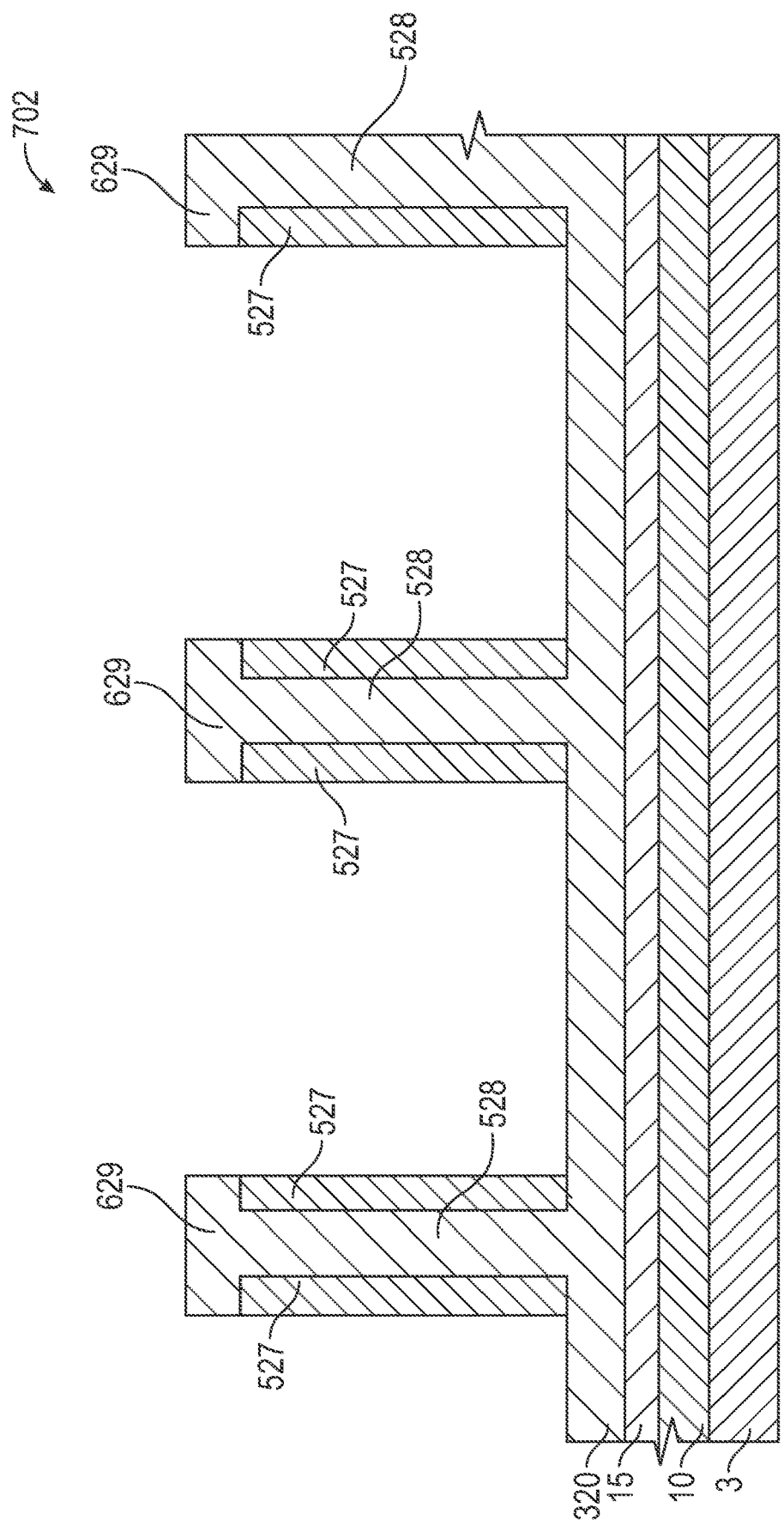

FIG. 7 shows change to structure 602 of FIG. 6 after etching to remove the remaining portions of the sacrificial region 325, forming structure 702. A wet etch may be used. After the etch, separated columns of material, along the direction of digitline 10, extend from dielectric region 320. Each column includes two conductive regions 527 separated by dielectric material 528 with dielectric region 629 disposed on the two conductive regions 527 and the dielectric material 528.

Figure 8:
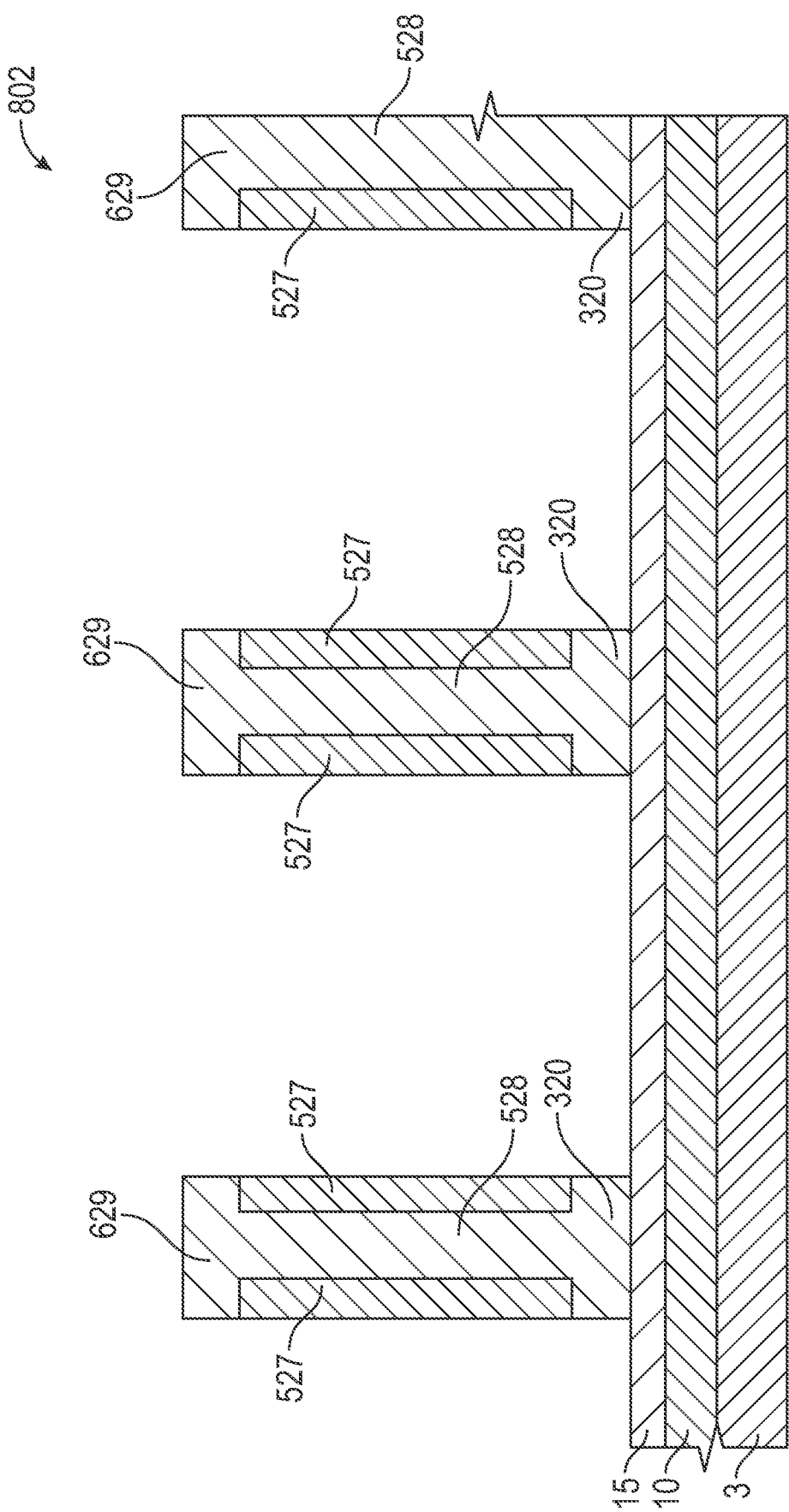

FIG. 8 shows change to the structure 702 of FIG. 7 after etching to remove the dielectric region 320 between the columns on doped region 15, forming structure 802. The etch exposes the portions of doped region 15 that are between the columns having two conductive regions 527 on the remaining dielectric region 320 and separated by dielectric material 528 with dielectric region 629 on the two conductive regions 527 and the dielectric material 528. Structure 802 includes repeated pairs of conductive regions 527 separated from the doped region 15 on digitline 10.

Figure 9:
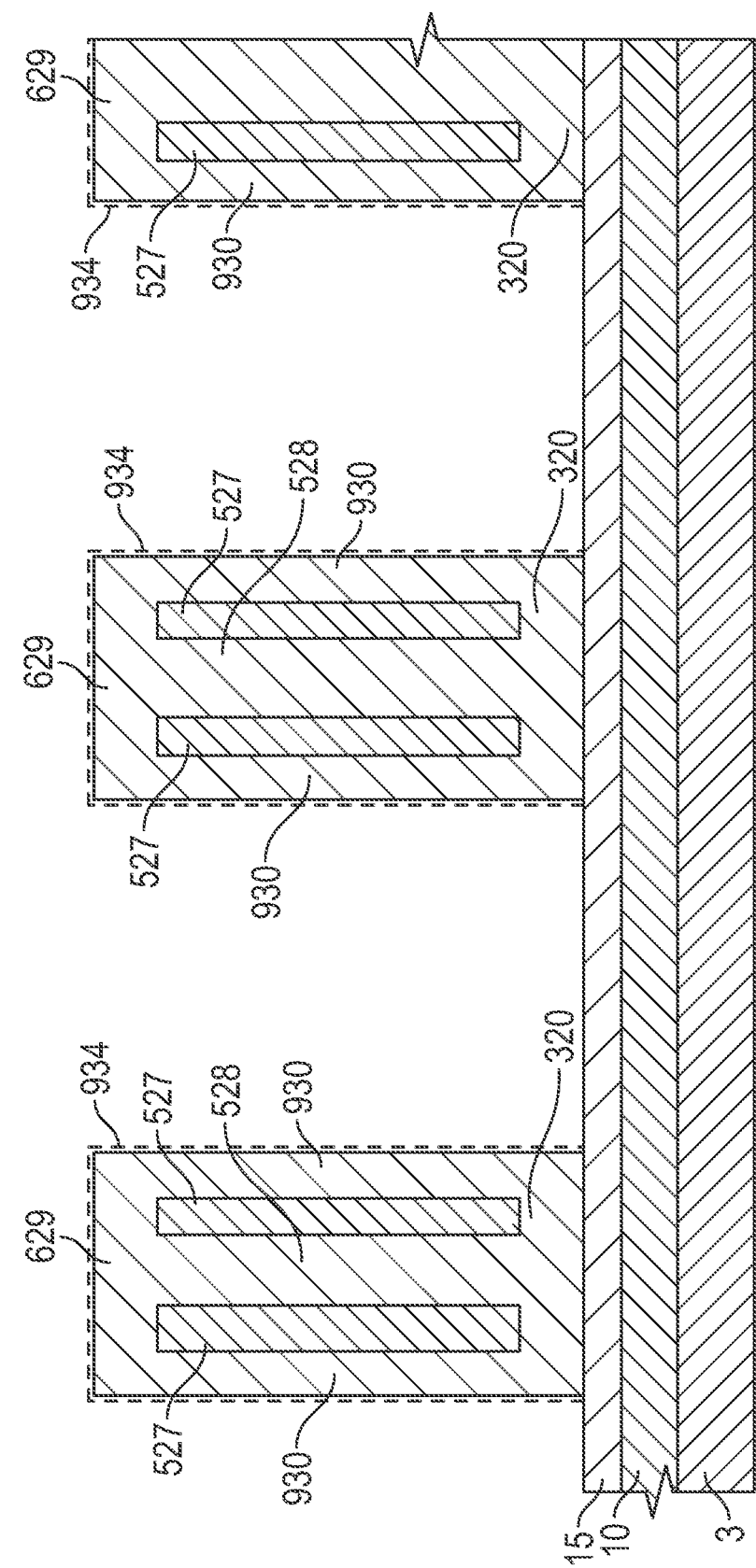

FIG. 9 shows change to the structure 802 of FIG. 8 after depositing a gate dielectric 930 adjacent to the two conductive regions 527 of each column. Gate dielectric 930 can be realized as a gate oxide. Gate dielectric 930 can include silicon, a high-κ dielectric, or combinations of dielectric materials. The deposition of gate dielectric may be conducted by depositing the gate dielectric 930 covering the two conductive regions 527 of each column and the exposed portions of doped region 15 of structure 802 followed by a spacer etch to remove portions of the deposited gate dielectric 930 re-exposing portions of doped region 15. Dielectric region 629 may remain as dielectric region 629, may be replaced by material of gate electric 930, or may be a combination of the material of dielectric region 629 and material of gate dielectric 930. This portion of the fabrication process can provide the first gate dielectric for the fin bodies of FinFETs being fabricated. Optionally, a thin region 934 of material that will form the fin bodies can be deposited on the first gate dielectric. The deposition of the first dielectric for the fin bodies of FinFETs followed by the spacer etch provides structure 902 with repeated columns, along the digitline 10, in which two conductive regions 527 are embedded in dielectric material disposed on doped region 15 on digitline 10.

Figure 10:
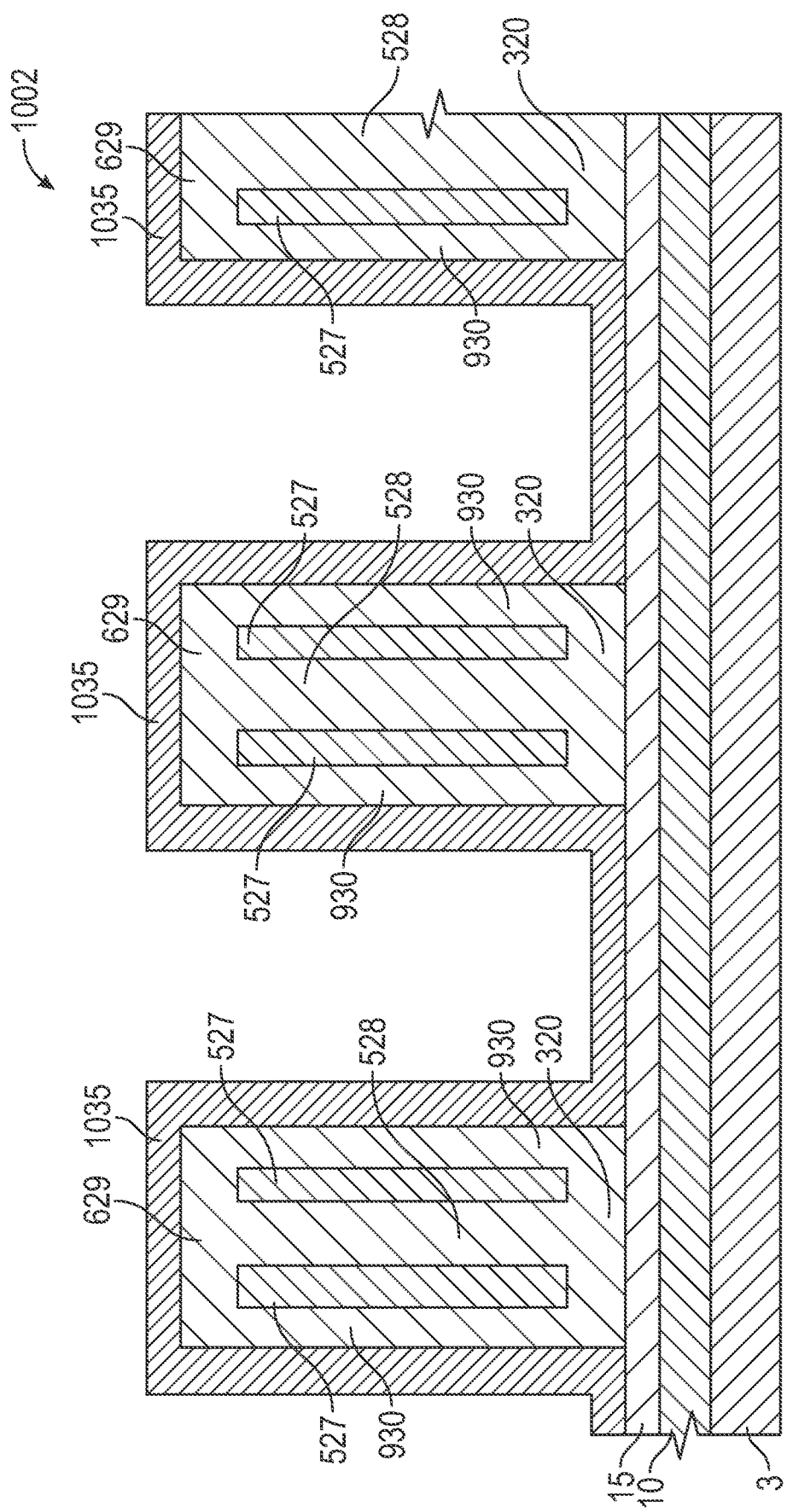

FIG. 10 shows change to the structure 902 of FIG. 9 after depositing material 1035 for fin bodies across the surface, forming structure 1002. The material for the fin bodies can be a polycrystalline semiconductor material. The poly material can be undoped semiconductor material or semiconductor material doped lightly with respect to the doping level of the doped region 15. Depositing material 1035 may be the same material as doped region 15, but undoped or doped lightly with respect to the doping level of the doped region 15. Each conductive region 527 is separated from deposited material 1035 by gate dielectric 930, which is adjacent to the two conductive regions 527 of each column. Processing of the deposited material 1035 can be conducted in the z direction forming the repeated structured shown in FIG. 10, substantially parallel to in the digitline 10. At this point, the deposited material 1035 can be patterned along the direction of digitline 10 using an isotropic etch. This processing can be conducted to form an array with a 30 nm line/18 nm trench pattern for a 48 nm pitch. Other patterns may be implemented.

Figure 11:
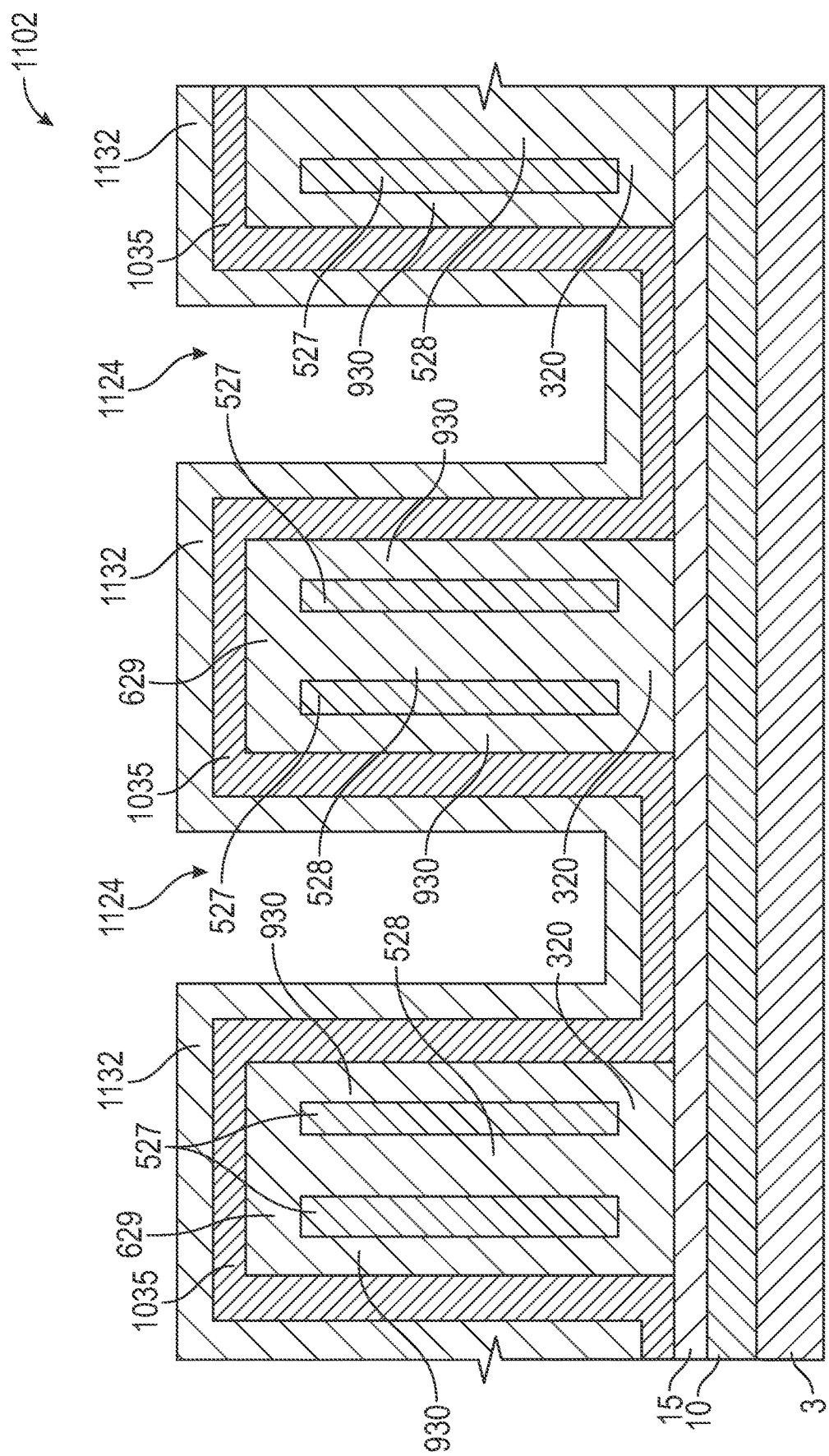

FIG. 11 shows change to the structure 1002 of FIG. 10 after depositing dielectric material 1132 on the surface of structure 1002, forming structure 1102. Dielectric material 1132 can be deposited to provide a second gate dielectric for the FinFETs being formed. Dielectric material 1132 can be an oxide. Dielectric material 1132 can include silicon, a high-κ dielectric, or combinations of dielectric materials. Dielectric material 1132 may have the same composition as gate dielectric 930. The deposition of the second dielectric for the fin bodies of FinFETs followed by a spacer etch provides structure 1102 with repeated columns, along the digitline 10, are separated by trenches 1124.

Figure 12:
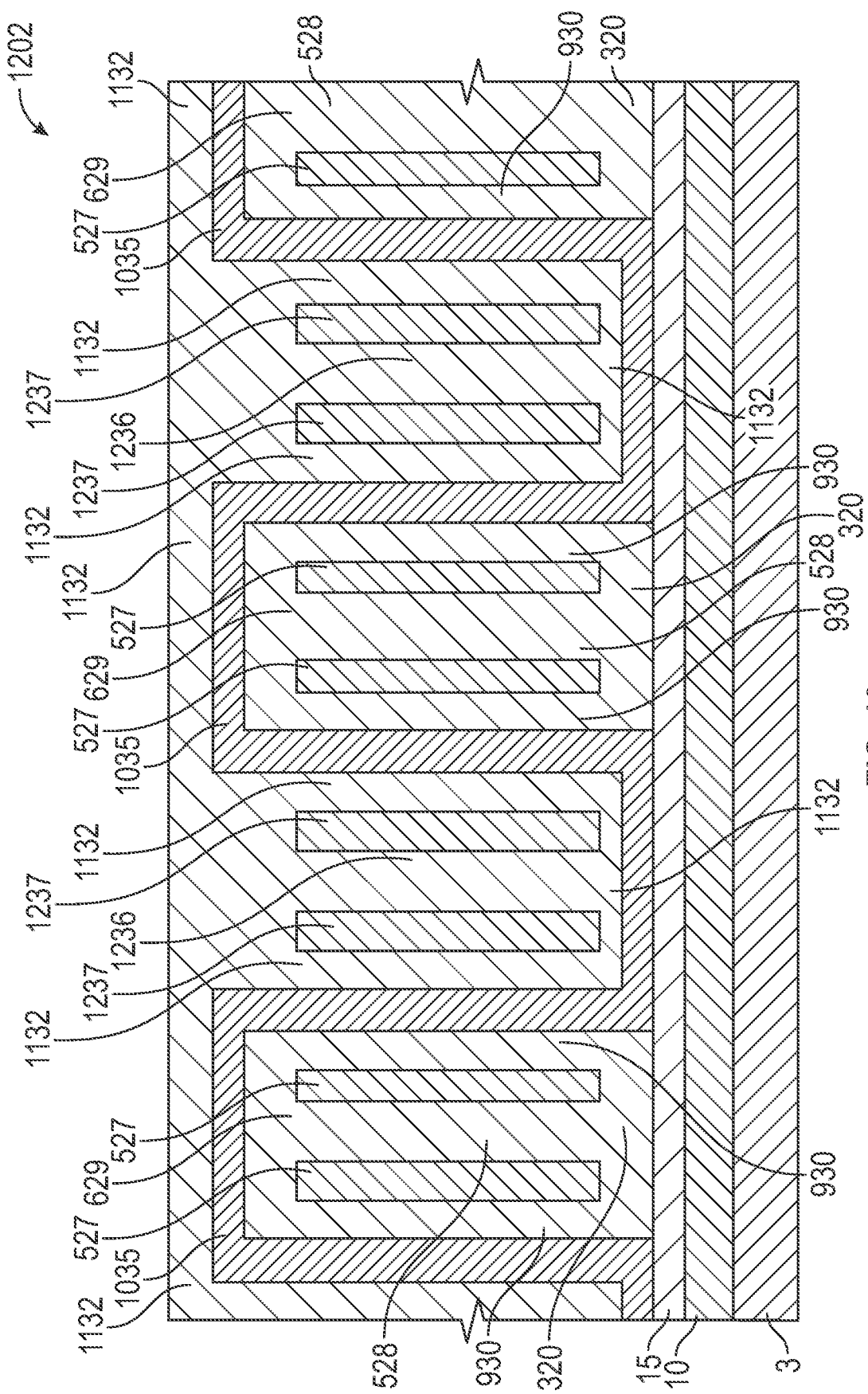

FIG. 12 shows change to the structure 1102 of FIG. 11 after depositing a conductive material in trenches 1124, conducting a spacer etch to form two conductive regions 1237 on dielectric material 1132 in trenches 1124, and filling the remaining portions of trenches 1124 with dielectric material 1236, forming structure 1202. Dielectric material 1236 fills the region between the two conductive regions 1237 in previously formed trenches 1124. Dielectric material 1236 can have the same composition as gate dielectric 930 and/or gate dielectric 1132. Dielectric material 1236 can be an oxide. Conductive regions 1237 may be composed of TiN. Other conductive material can be used. Conductive regions 1237 may be composed of the same material as conductive regions 527. Conductive regions 1237 form portions of second access lines. Such second access lines may be formed substantially perpendicular to digitline 10. The second access lines may be word lines. The processing conducted to include the z-direction for the array being formed.

Figure 13:
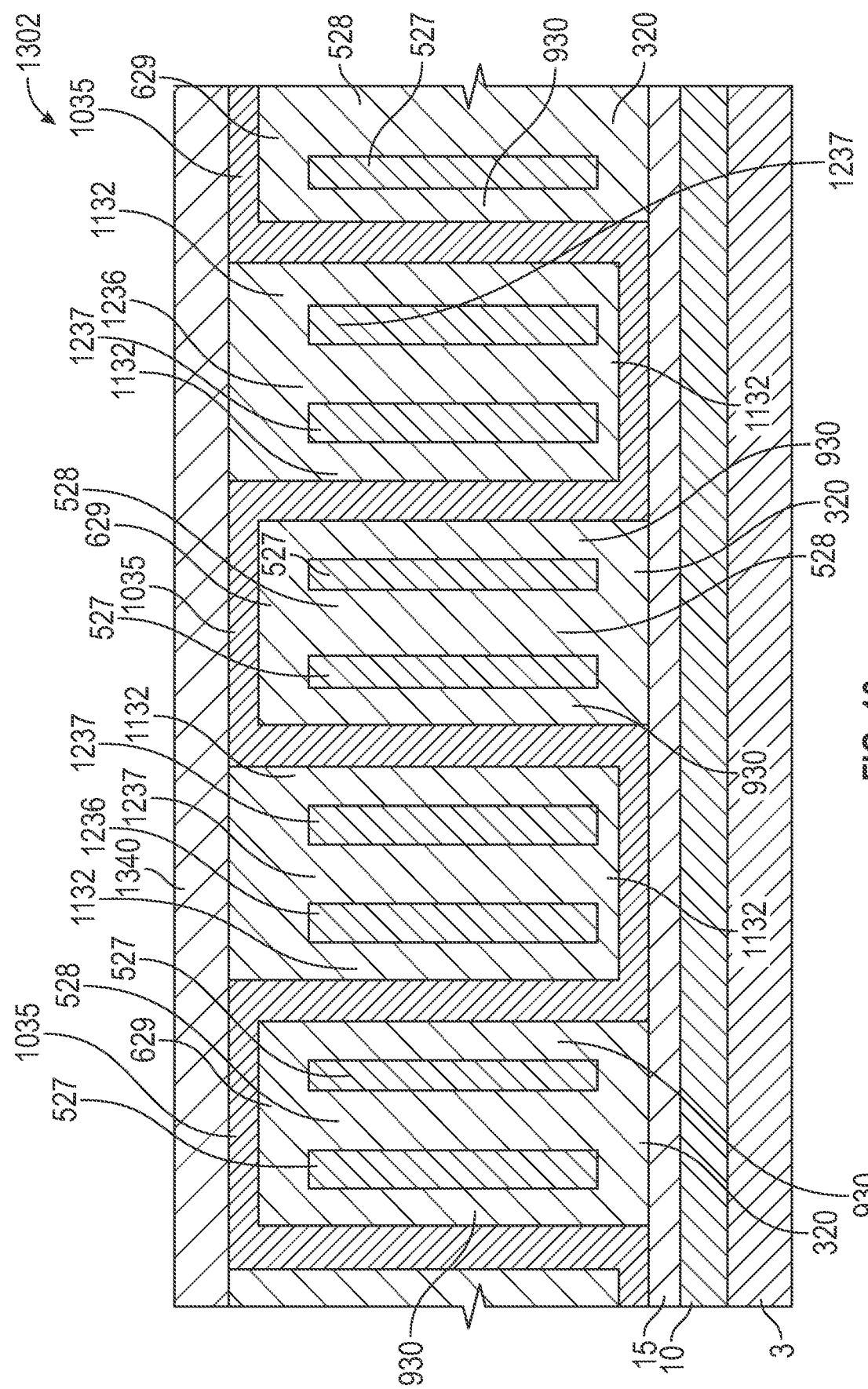

FIG. 13 shows change to the structure 1202 of FIG. 12 forming structure 1302 after conducting a CMP to remove portions of dielectric material 1132 and 1236 to expose portions of deposited material 1035 near the top of structure 1202 distal from doped region 15, followed by forming doped region 1340 across the surface in the direction of the digitline 10. Doped region 1340 may have substantially the same composition as doped region 15. Doped region 1340 may have substantially the same composition as doped region 15 with variations in doping. Doped region 1340 and doped region 15 can have substantially the same composition as deposited material 1035, but doped more highly relative to deposited material 1035.

Figure 14:
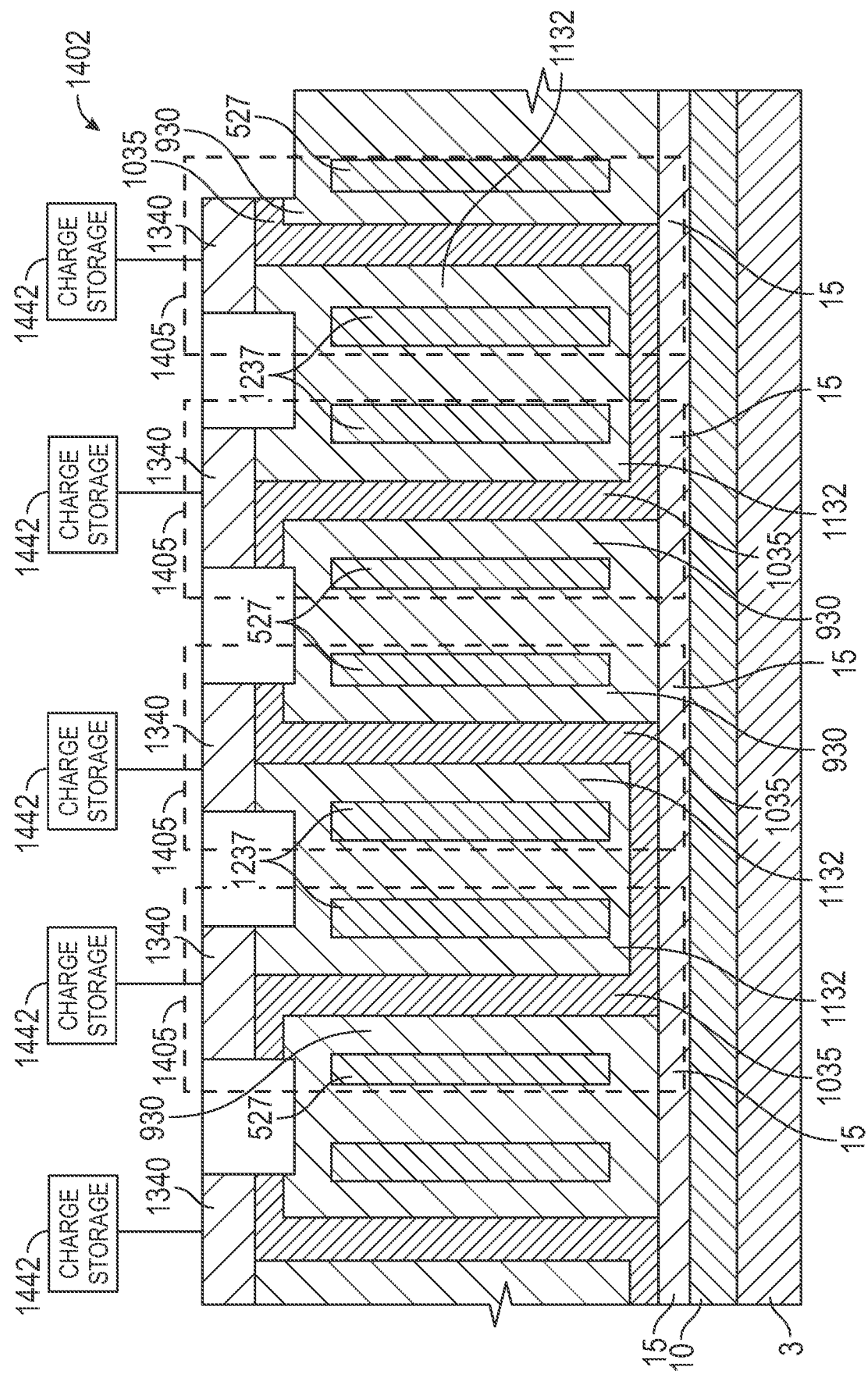

FIG. 14 shows change to the structure 1302 of FIG. 13 after removing portions of doped region 1340, deposited material 1035, and dielectric material 1236, forming structure 1402. Removing these portions provides multiple cells along the digitlines, such as cells 1405. As with previous figures, FIG. 14 shows a cross-sectional view along digitline 10. Digitlines and access lines can be patterned by any suitable process, for example using 193 nm immersion lithography. Cells 1405 include fin body 1035 coupling doped region 15 to doped region 1340 with fin body separated from gates 527 and 1237 by gate dielectrics 930 and 1132, respectively, and with doped region 15 coupled to digitline 10. Fin body 1035, which includes the channel for the FinFET of cell 1405, can be disposed substantially perpendicular to the plane that includes the surface of digitline 10.

Each of the cells 1405 can be further processed as part of a cell of an array in a device. For example, each of the cells 1405 can be formed as memory cells of an array of a memory device. In processing the array, the access lines, realized as gates 527 and 1237 that extend in the z-direction with respect to digitlines 10, can be cut at the end of the array to avoid shorts. In an embodiment, for each of the cells 1405, the digitline connects the array to one or more circuits outside the array. For a memory array, with each cell 1405 processed to connect each doped region 1340 to an individual charge storage element 1442, the digitline 10 can connect a sense amplifier, for example, to each charge storage element 1442 via the access transistor formed by the FinFET comprising fin body 1035, doped region 15, doped region 1340, gates 527 and 1237, and gate dielectrics 930 and 1132. All the FinFETs along a digitline 10 can be connected on one side to a digitline 10, while the top of each FinFETs at 1340 can be connected to an individual capacitor to hold information charge (+ or −). Other types of charge storage elements can be used. The cells 405 coupled with charge storage elements 1442 may be used in dynamic random access memories (DRAMs). Poly FinFETs, taught herein, can be used as selector devices in a three dimensional (3D) flash memory and they can be used in a 3D ferroelectric memory (FRAM). These applications have less critical off current criteria than DRAM, as the charge is not stored in a capacitor and subject to transistor leakage, but the information is stored in ferroelectric material or in a floating poly gate. Improved smaller poly devices also can have NAND applications. In NAND, the poly devices can be much larger as they are used for a digit line select rather than a cell element. The portion of the region 1035 formed parallel to digitline 10, using an embodiment of the technique taught herein, is a part of an interconnect of the FinFETs to the digitline 10. The material of region 1035 forming the channel, which is the fin body, of the FinFETs and the part of the interconnect can be a poly material. The material for gates 527 and 1237 and digitline 10 can be low ohmic material. For example, gates/access lines 527 and 1237 can include TiN and digitline 10 can include W, though other low ohmic materials may be used. The portion of the region 1035 formed parallel to digitline 10 adds capacitance without reducing resistance significantly, and, hence, makes signally at this part slower. However, the portion of the region 1035 formed parallel to digitline 10 provides for the contact area between the fin body of region 1035, which extends to doped region 1340, and the conductive digitline 10 to be larger that contact to the fin body of region 1035 and such contact area is more reliable than a smaller contact area directly to the fin body of region 1035.

The processing associated with FIGS. 3-14 can be implemented with an array count with 193 immersion processing with respect to the digitlines of 24 nm/24 nm line/space, 193 dry processing with respect to the access lines of 24 nm/72 nm trench/line, 193 immersion processing with respect to the fin body in the digitline direction of 30 nm/18 nm line/space, 193 immersion processing with respect to the digitline landing pad of 30 nm/18 nm line/space, and 193 immersion processing with respect to the access line landing pad of 30 nm/18 nm line/space. Other array counts may be used.

Processing similar to the techniques associated with FIGS. 3-14 can be used to form one or more individual FinFETs with deposited fin bodies that are not part of an array of memory cells in an integrated circuit. Such processing can be conducted with appropriate masking such that digitline 10 is a signal line coupled to only one cell 1405 to perform a function according to a particular design for the integrated circuit in which it is being fabricated.

Figure 15:
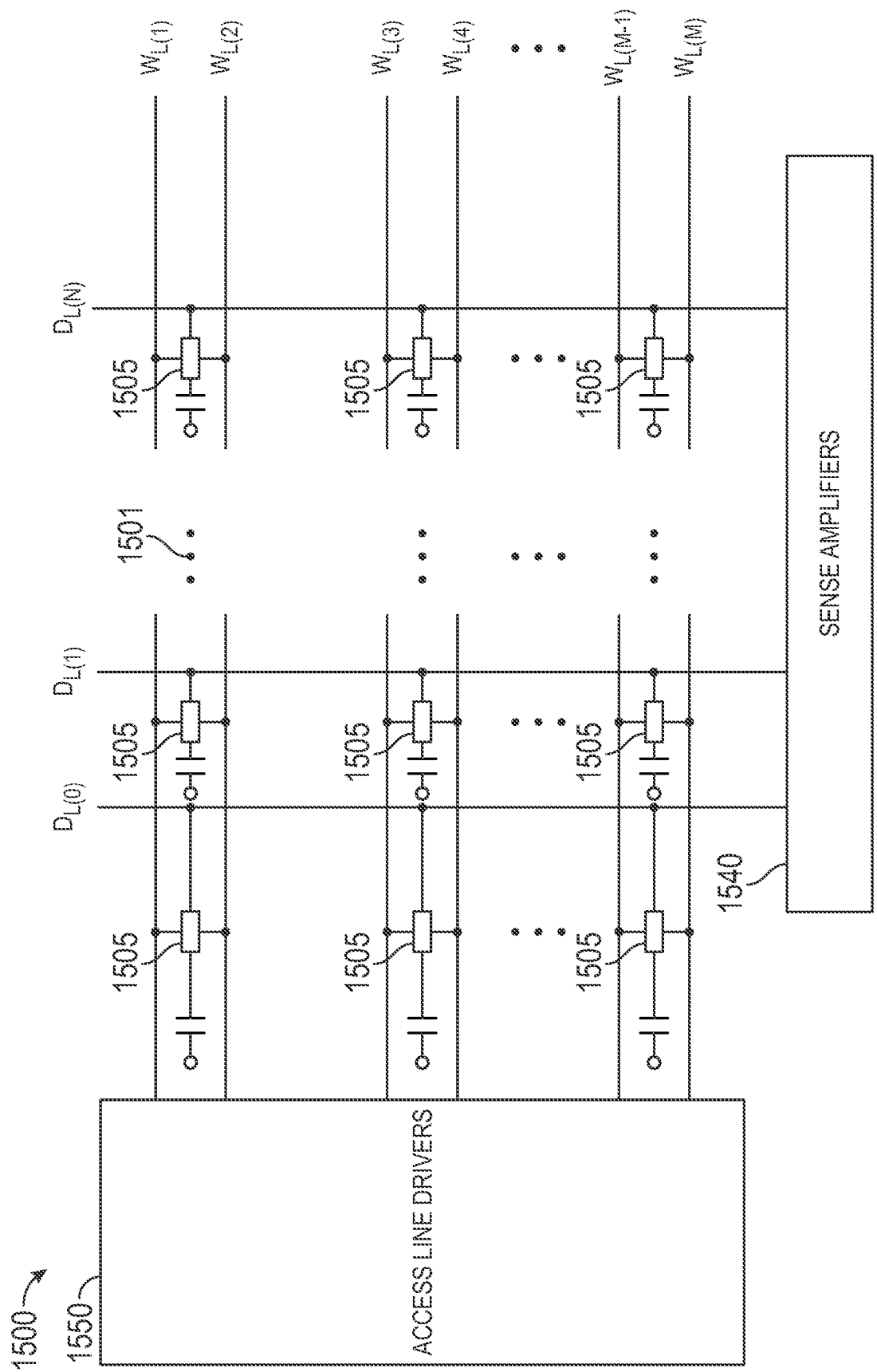
FIG. 15 is a block diagram of an example memory device, in accordance with various embodiments.

FIG. 15 is a block diagram of an example embodiment of an example memory 1500. Memory 1500 can include a memory array 1501 having a plurality of memory cells, where each memory cell includes a FinFET 1505. A memory array is a systematic physical arrangement of memory cells that can be logically arranged according to a plurality of parameters. In various embodiments, each memory cell can be addressed according to values of two parameters. The two parameters may be referred to as a row and a column. A memory cell may be logically located in the memory array and indexed uniquely according to a value for a row and a value for a column. Rows and columns are not limited to a particular physical orientation or linear relationship, so that the logical arrangement can be vastly different than the physical arrangement. A column of a memory array may be arranged as a group of memory cells that can be accessed at the same time by a decoder assigned to column values. A row of a memory array may be arranged as a group of memory cells that can be accessed at the same time by a decoder assigned to row values.

FinFETs 1505 of the memory cells of memory array 1505 can be realized as FinFETs having deposited fin bodies. Such FinFETs having deposited fin bodies can be structured and formed in accordance with structures and processing as taught herein. Each FinFET can be coupled to one of a number of digitlines DL(0), DL(1), . . . DL(N)s at one end of the FinFET 1505 and to a capacitor at the other end of the FinFET 1505, where the twos ends are coupled to each other by the fin body of FinFET 1505. Digitlines DL(0), DL(1), . . . DL(N)s can be coupled to a sense amplifier 1540. Sense amplifier 1540 operates to determine the value of information read from the capacitor of a selected memory cell accessed via its FinFET 1505. Access to the selected memory cell can be achieved through access lines that can be structured as access lines WL(1), WL(2), WL(3), WL(4) . . . WL(M–1), WL(M). Pairs of access lines can be coupled to a FinFET 1505. For example, WL(1) and WL(2) are coupled to the same set of FinFETs 1505, WL(3) and WL(4) are coupled to the same set of FinFETs 1505 . . . WL(M–1) and WL(M) are coupled to the same set of FinFETs 1505s. Signals on the set of access lines WL(1), WL(2), WL(3), WL(4) . . . WL(M–1), WL(M) can be controlled by access line drivers 1550.

In various embodiments, a device can comprise: a digitline; a first dielectric; a deposited fin body extending from a first doped region contacting the digitline to a second doped region distal from the digitline, the deposited fin body deposited on the first dielectric; a first gate separated from the deposited fin body by the first dielectric; a second dielectric adjacent the deposited fin body on a side of the deposited fin body opposite the first dielectric; and a second gate separated from the deposited fin body by the second dielectric. The deposited fin body can have a thickness in the range of 10 angstroms to 100 angstroms. The first doped region contacting the digitline can include material of the fin body doped to a higher level than the material of the fin body. The first doped region contacting the digitline, the first dielectric, the first gate, the second dielectric, the second gate, and the fin body can be structured as an access transistor in the device.

In various embodiments, a device can comprise a number of digitlines and multiple fin field effect transistors disposed on each digitline. Each fin field effect transistor on each digitline can include a first dielectric; a deposited fin body extending from a first doped region contacting the digitline to a second doped region distal from the digitline, the deposited fin body deposited on the first dielectric; a first gate separated from the deposited fin body by the first dielectric; a second dielectric adjacent the deposited fin body on a side of the deposited fin body opposite the first dielectric; and a second gate separated from the deposited fin body by the second dielectric. The device can comprise multiple access lines, each access line coupled to the first gate and the second gate of a different one of the multiple fin field effect transistors.

Such a device or a similar or identical device can include a number of features. The deposited fin body can include a polycrystalline semiconductor material. The deposited fin bodies of directly adjacent fin field effect transistors disposed on the same digitline can be coupled to each other by a region disposed on and contacting the first doped region contacting the digitline, the region composed of the polycrystalline semiconductor material. The first gate of a fin field effect transistor of the multiple fin field effect transistors can be separated from the second gate of a directly adjacent fin field effect transistor disposed on the same digitline by an oxide. The multiple fin field effect transistors disposed on each digitline of the number of digitlines can be structured having a 48 nm array pitch.

Figure 16:
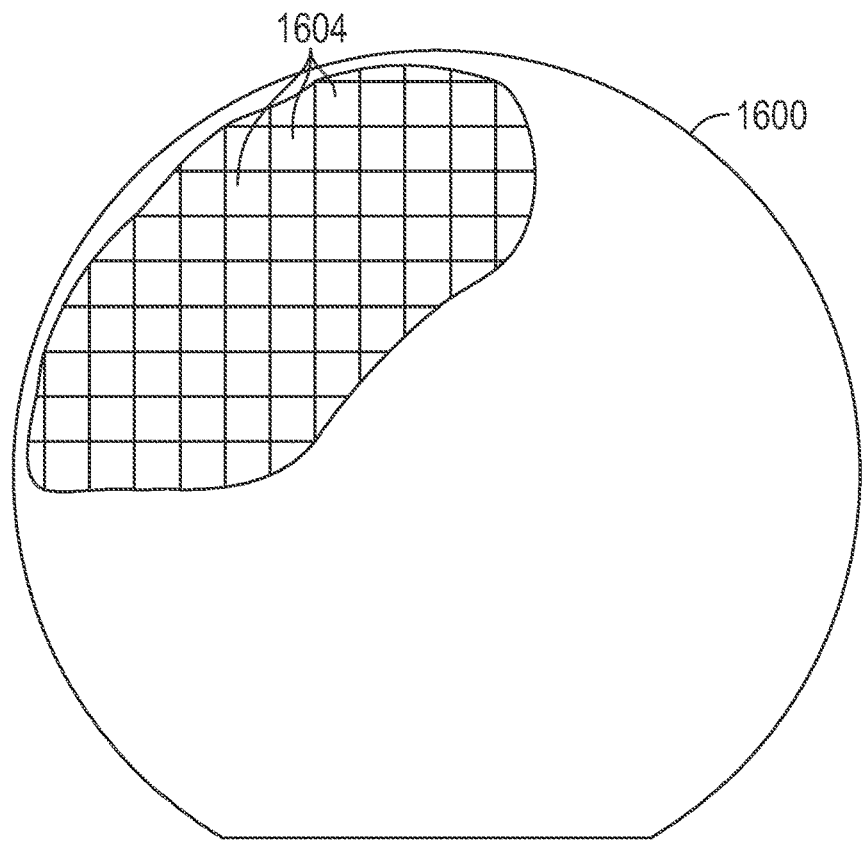
FIG. 16 shows a finished wafer, in accordance with various embodiments.

FIG. 16 illustrates an example of a wafer 1600 arranged to provide multiple electronic components. Wafer 1600 can be provided as a wafer in which a plurality of dice 1604 can be fabricated. Alternatively, wafer 1600 can be provided as a wafer in which the plurality of dice 1604 have been processed to provide electronic functionality and are awaiting singulation from wafer 1600 for packaging. Wafer 1600 can be provided as a semiconductor wafer, a semiconductor on insulator wafer, or other appropriate wafer for processing electronic devices such as an integrated circuit chips. Wafer 1600 can be fabricated in accordance with any one or more embodiment related to FIGS. 1-15.

Using various masking and processing techniques, each die 1604 can be processed to include functional circuitry such that each die 1604 is fabricated as an integrated circuit with the same functionality and packaged structure as the other dice on wafer 1600. Alternatively, using various masking and processing techniques, various sets of dice 1604 can be processed to include functional circuitry such that not all of the dice 1604 are fabricated as an integrated circuit with the same functionality and packaged structure as the other dice on wafer 1600. A packaged die having circuits integrated thereon providing electronic capabilities is herein referred to as an integrated circuit (IC).

Wafer 1600 can include multiple dice, where each dice includes a signal line with a FinFET, having a deposited fin body, coupled to the signal line. In an embodiment, wafer 1600 can include multiple dice, in which each die 1604 of the multiple dice includes a digitline, and a FinFET coupled to the digitline, where the FinFET has a first dielectric; a deposited fin body extending from a first doped region contacting the digitline to a second doped region distal from the digitline, the deposited fin body deposited on the first dielectric; a first gate separated from the deposited fin body by the first dielectric; a second dielectric adjacent the deposited fin body on a side of the deposited fin body opposite the first dielectric; and a second gate separated from the deposited fin body by the second dielectric. Each die 1604 can include a number of digitlines with multiple fin field effect transistors disposed on each digitline. The multiple FinFETs disposed on each digitline of the number of digitlines can be structured having a 48 nm array pitch. The deposited fin body of FinFETs in die 1405 can include multiple material compositions. The digitline in each die can be coupled to a sense amplifier in each die.

Figure 17:
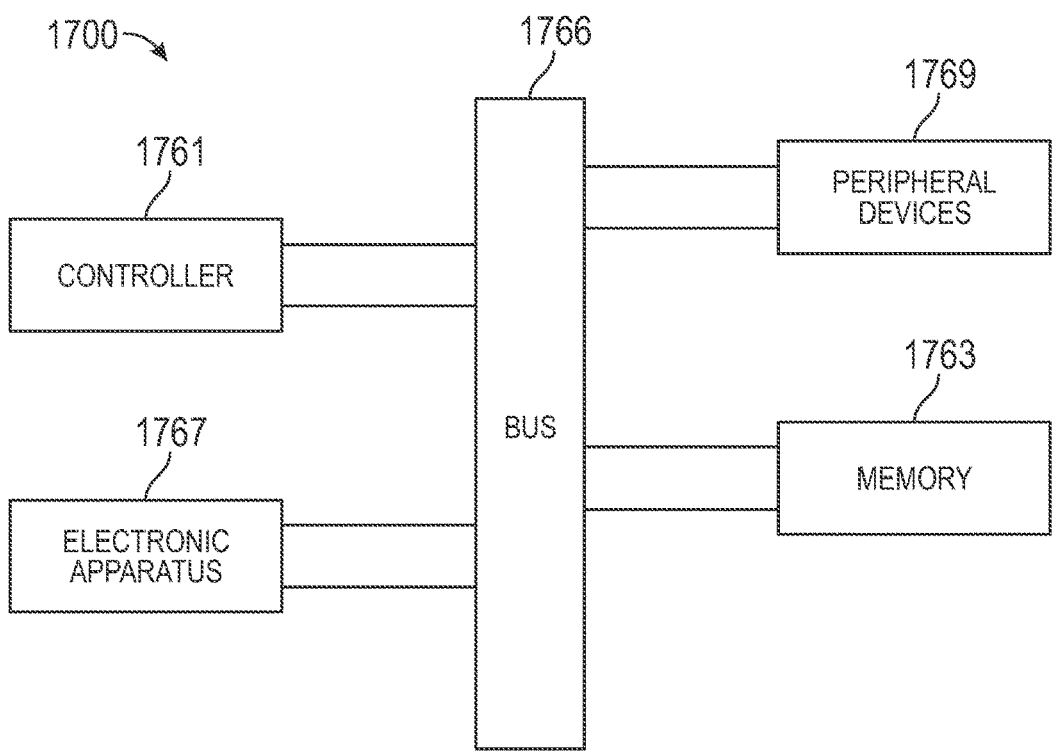
FIG. 17 shows a block diagram of various features of an electronic system, in accordance with various embodiments.

FIG. 17 shows a block diagram of a system 1700 that includes one or more components have a FinFET with a deposited fin body. The deposited fin body can be realized in a manner similar to or identical to structures in accordance with various embodiments as taught herein. Such structures can include the deposited fin body constructed in a process similar to or identical to processes in accordance with various embodiments as taught herein. The FinFET with a deposited fin body can be disposed in any of the components of system 1700 as access transistor to one or more individual circuit elements or one or more circuits.

System can include a controller 1761 operatively coupled to memory 1763. System 1700 can also include an electronic apparatus 1767 and peripheral devices 1769. One or more of controller 1761, memory 1763, electronic apparatus 1767, and peripheral devices 1769 can be in the form of one or more ICs. A bus 1766 provides electrical conductivity between and/or among various components of system 1700. In an embodiment, bus 1766 can include an address bus, a data bus, and a control bus, each independently configured. In an alternative embodiment, bus 1766 uses common conductive lines for providing one or more of address, data, or control, the use of which is regulated by controller 1761. Controller 1761 can be realized in the form or one or more processors.

Electronic apparatus 1767 may include additional memory. Memory in system 1700 may be constructed with one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory. Peripheral devices 1769 may include displays, imaging devices, printing devices, wireless devices, additional storage memory, and control devices that may operate in conjunction with controller 1761.

A FinFET with a deposited fin body, as taught herein, can be implemented in one or more of controller 1761, memory 1763, electronic apparatus 1767, peripheral devices 1769, and bus 1766. In various embodiments, system 1700 can include, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A method of fabricating a device having a fin field effect transistor, the method comprising:
   forming a fin field effect transistor including;
   forming a structure extending from a base on a substrate, including forming the structure having a first dielectric with a dielectric surface extending from the base, the structure having a first conductive region within the first dielectric with the first dielectric having a portion of the first dielectric on top of the first conductive region;
   depositing material on the dielectric surface and on the portion of the first dielectric on top of the first conductive region, and maintaining at least a portion of the deposited material to form a fin body of the fin field effect transistor;
   forming a second dielectric contacting the fin body on a surface of e fin body opposite the dielectric surface of the first dielectric;
   forming a second conductive region on the second dielectric, the second conductive region separated from the fin body by the second dielectric; and
   forming a doped region to the fin body.

2. The method of claim 1, wherein forming the structure extending from the base on the substrate includes:
   forming the first conductive region extending from above the base to a level less than a top surface of the structure; and
   forming the first dielectric as part of a first region adjacent to and contacting the first conductive region.

3. The method of claim 2, wherein the first dielectric and the first region have a substantially same dielectric oxide composition.

4. The method of claim 1, wherein forming the structure extending from the base on the substrate includes forming the base by:
   forming a conductive region on the substrate, the conductive region formed as a digitline for the device; and
   forming a doped region on and contacting the digitline such that the structure is formed extending from the doped region.

5. The method of claim 4, wherein the conductive region formed as a digitline includes tungsten.

6. The method of claim 1, wherein depositing material on the dielectric surface includes depositing a polycrystalline silicon material.

7. The method of claim 1, wherein forming the doped region to the fin body includes forming the doped region on a portion of the deposited material that is substantially, perpendicular to the formed fin body.

8. The method of claim 1, comprising coupling the doped region to a charge storage element.

9. The method of claim 8, wherein the charge storage element is a capacitor.

10. A method of fabricating a device having multiple fin field effect transistors, the method comprising:
    forming a structure extending from a base on a substrate, including forming the structure having a first dielectric extending from the base, the structure having a first conductive region separated from a second conductive region by the first dielectric with the first dielectric having a portion of the first dielectric on top of the first conductive region and on top of the second conductive region;
    forming a second dielectric extending from the base with the second dielectric formed along and contacting the first conductive region;

forming a third dielectric extending from the base with the third dielectric formed along and contacting the second conductive region such that the first conductive region and the second conductive region are within a dielectric region formed by the first, second, and third dielectric;

depositing material on the dielectric region such that a first portion of the material is along and contacting the second dielectric opposite the first conductive region, a second portion of the material is along and contacting the third dielectric opposite the second conductive region, and a top portion of the material is on the portion of the first dielectric on top of the first and second conductive regions;

forming a doped region on the top portion of the material; and removing a portion of the doped region and a portion of the top portion of the material on which the portion of the doped region is formed, such that a first fin body of a first fin field effect transistor is formed including the first portion of the material and a second fin body of a second fin field effect transistor is formed including the second portion of the material.

11. The method of claim 10, wherein, after removing the portion of the doped region and the portion of the top portion of the material, the first fin body includes a first part of a remaining top portion of the material and the second fin body includes a second part of the remaining top portion of the material.

12. The method of claim 10, wherein the first and second conductive regions are formed on a lower dielectric region, with the lower dielectric region on and contacting the base.

13. The method of claim 12, comprising forming the base along a digitline for the device.

14. The method of claim 13, the material on the dielectric region is undoped or doped at orders of magnitude less than a doping level of the base.

15. The method of claim 13, comprising forming additional fin field effect transistors in additional to the first and second fin field effect transistors such that fin bodies of the additional fin field effect transistors, the first fin field effect transistor, and the second fin field effect transistor are deposited on and contacting the base with the base on and contacting the digitline.

16. The method of claim 15, wherein forming the additional fin field effect transistors, the first fin field effect transistor, and the second fin field effect transistor includes forming the additional fin field effect transistors, the first fin field effect transistor, and the second fin field effect transistor with two gates with the respective fin body between the two gates.

17. A device having a fin field effect transistor, the device comprising:
a fin field effect transistor having a channel for transistor operation, with the fin field effect transistor including:
a structure extending from a base on a substrate, the structure having a first dielectric with a dielectric surface extending from the base and having a first conductive region contacting the first dielectric on a side of the first conductive region, with the first dielectric having a portion of the first dielectric on top of the first conductive region;
a deposited fin body of the fin field effect transistor on the dielectric surface and on the portion of the first dielectric on top of the first conductive region, the deposited fin body structured vertically including the channel of the fin field effect transistor;
a second dielectric contacting the fin body on a surface of the fin body opposite the dielectric surface of the first dielectric;
a second conductive region adjacent and contacting the second dielectric, the second conductive region separated from the fin body by the second dielectric; and
a doped region on and contacting the fin body opposite the substrate.

18. The device of claim 17, wherein the fin body is on and contacting the base with the base contacting a digitline.

19. The device of claim 18, comprising additional fin field effect transistors arranged such that fin bodies of the additional fin field effect transistors are on and contacting the base with the base contacting the digitline.

20. The device of claim 17, wherein the doped region is coupled to a charge storage element.

* * * * *